(12) United States Patent
Moors et al.

(10) Patent No.: US 7,098,994 B2
(45) Date of Patent: Aug. 29, 2006

(54) LITHOGRAPHIC APPARATUS, DEVICE MANUFACTURING METHOD, AND DEVICE MANUFACTURED THEREBY

(75) Inventors: Johannes Hubertus Josephina Moors, Helmond (NL); Uwe Mickan, Veldhoven (NL); Harm-Jan Voorma, Zaltbommel (NL); Johannes Christiaan Leonardus Franken, Knegsel (NL)

(73) Assignee: ASML Netherlands B.V., Veldhoven (NL)

(*) Notice: Subject to any disclaimer, the term of this patent is extended or adjusted under 35 U.S.C. 154(b) by 42 days.

(21) Appl. No.: 10/758,270

(22) Filed: Jan. 16, 2004

(65) Prior Publication Data
US 2005/0157284 A1 Jul. 21, 2005

(51) Int. Cl.
*G03B 27/72* (2006.01)
*G03B 27/52* (2006.01)
*G03B 27/54* (2006.01)

(52) U.S. Cl. .............................. 355/71; 355/55; 355/67

(58) Field of Classification Search ................. 355/71, 355/53, 67, 69, 70, 77, 30, 55; 359/883, 359/845; 250/492.1; 362/293, 96, 264
See application file for complete search history.

(56) References Cited

U.S. PATENT DOCUMENTS 5,906,429 A 5/1999 Mori et al.
2003/0223136 A1* 12/2003 Bade et al. ................. 359/883
2003/0235682 A1* 12/2003 Sogard ..................... 428/195.1
2004/0227103 A1 11/2004 Singer et al.
2005/0099611 A1* 5/2005 Sogard ........................ 355/30

FOREIGN PATENT DOCUMENTS

| EP | 0 532 236 A1 | 3/1993 |
| EP | 1 037 510 A2 | 9/2000 |
| EP | 1 225 481 A2 | 7/2002 |
| EP | 1 037 510 A3 | 1/2004 |

* cited by examiner

*Primary Examiner*—Peter B. Kim
(74) *Attorney, Agent, or Firm*—Pillsbury Winthrop Shaw Pittman LLP

(57) ABSTRACT

A lithographic apparatus includes an illumination system for providing a beam of radiation, a support structure for supporting a patterning device, the patterning device serving to impart the beam with a pattern in its cross-section. The apparatus further includes a substrate table for holding a substrate, a projection system for projecting the patterned beam onto a target portion of the substrate, and a collector which is arranged for transmitting radiation, received from a first radiation source, to the illumination system. The apparatus includes at least a heater for heating the collector when the collector receives substantially no radiation from the first radiation source. Further aspects of the invention relate to a device manufacturing method as well as a device manufactured thereby.

29 Claims, 5 Drawing Sheets

LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates to a lithographic apparatus. The invention further relates to a method of manufacturing a device, as well as a device manufactured thereby.

2. Brief Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti parallel to this direction.

The known apparatus comprises a collector for collecting radiation from a radiation source. The collector is arranged for transmitting the collected radiation to an illumination system. The illumination system is arranged for providing a projection beam of radiation, which is used for applying a desired pattern onto a target portion of a substrate. The collector comprises for example suitable radiation reflecting mirror shells. Such a collector is known from the European patent application EP 1225481, which is incorporated herein by reference. Particularly, the collector is arranged to focus incoming radiation, received from the radiation source, onto a small focusing area or focussing point.

A disadvantage of the known apparatus is, that the collector is heated up by the incoming radiation, each time the respective radiation source is switched on. As a result, the collector expands, leading to a shift in direction of the outgoing radiation and/or a translation of the focussing point of the radiation and distortion of a resulting illumination beam. Consequently, it is difficult or impossible for the illuminating system to generate a projection beam of radiation with certain desired characteristics, having for instance a suitable homogeneity, radiation distribution, beam direction, beam intensity, beam cross-section and the like. Besides, the distortion of the projection radiation, caused by the thermal expansion of the collector, hampers the manufacturing of devices with a desired high precision.

SUMMARY OF THE INVENTION

It is an aspect of the present invention to improve the lithographic apparatus. In particular, an aspect of the invention aims to provide a lithographic apparatus for manufacturing devices with high precision.

According to an aspect of the invention, there is provided a lithographic apparatus comprising: an illumination system constructed to provided a beam of radiation; a support structure constructed to support a patterning device, the patterning device serving to impart a cross-section of the beam with a pattern to form a patterned beam; a substrate table for holding a substrate; a projection system that projects the patterned beam onto a target portion of the substrate; a collector being constructed to receive radiation from a first radiation source and transmit radiation to the illumination system; and at least one heater for heating the collector when the collector receives substantially no radiation from the first radiation source.

During use, the heater heats the collector at least when the collector receives substantially no radiation from the first radiation source. Therefore, temperature variations of the collector can be diminished or prevented. Preferably, the temperature of the collector is kept substantially constant by using the heater, or, for instance, within a relatively small range. The small temperature range may comprise small offsets from a desired operating temperature. Such temperature range may be, for example, a range of plus and minus about 50° C. from an average operating temperature. As a result, the dimensions or the shape of the collector can be kept relatively constant or within certain limits, so that the radiation may be transmitted in a desired direction and/or focussed onto a desired spot. Thus, a radiation beam with desired, substantially constant, optical characteristics can be provided. Such radiation beam can be advantageously used in the manufacturing of devices.

According to an aspect of the invention, there is provided a collector for use in a lithographic apparatus, the collector comprising: reflecting elements being constructed to receive radiation from a first radiation source, each of the reflecting elements having a reflecting surface to reflect the radiation received from the first radiation source towards a focussing point; and a heater thermally coupled to the reflecting elements and constructed to heat the reflecting elements.

During use, deformation of the collector can be prevented or diminished by additionally heating the collector using the heater. Such heating may be applied during each period when the first radiation source is switched off, wherein no radiation is received by the collector from the first radiation source. In that case, a cooling of the collector is prevented by a compensating heating, resulting from the activation of the heater. By preventing the deformation of the collector during an active period of the first radiation source, the radiation of the first radiation source can be transmitted by the collector with a desired uniformity, in a desired pattern, focussed in a desired direction and/or angle or such.

Alternatively, the heater may be used to heat up the collector continuously to such a high operating temperature, with respect to a temperature the collector would reach by a heating due to the radiation of the first radiation source only, that the overall operating temperature of the collector is relatively constant in time. In that case, the radiation of the first radiation source has substantially no influence anymore on the operating temperature of the collector, due to the already high temperature thereof.

During use, heat may be removed from the collector in different ways, for conditioning the collector temperature and/or to prevent the collector from overheating. Heat may be removed from the collector by heat radiation, heat convection and/or heat conduction. Several heat transporters may be provided for conditioning the temperature of the collector, for instance heat pipes, cooling structures, thermal shrouds, heat conditioning fluids, liquids and/or gasses and the like.

According to a further aspect of the invention, a method of manufacturing a device is provided, comprising: providing a substrate; providing a first radiation source; transmitting radiation from the first radiation source to an illumination system through a collector; providing a beam of radiation using the illumination system; imparting the beam with a cross-sectional pattern to form a patterned beam of radiation; and projecting the patterned beam of radiation onto a target portion of the substrate; and maintaining the collector at a substantially constant operating temperature by selectively heating the collector.

According to a further embodiment of the invention, a lithographic apparatus is provided comprising: receiving and transmitting means for receiving radiation from a first radiation source and transmitting radiation to an illumination system; and means for heating the receiving and transmitting means.

According to a further embodiment of the invention, a method of manufacturing a device is provided comprising: transmitting radiation from a first radiation source to an illumination system through a collector; maintaining the collector at a substantially constant operating temperature by selectively heating the collector; and projecting a beam of radiation onto a target portion of a substrate.

This provides the above-mentioned advantages. Also, devices, for instance semiconductor devices or other types of devices, can be made with high precision by the method according to an aspect of the present invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts.

DETAILED DESCRIPTION OF ILLUSTRATED EMBODIMENTS

Figure 1:
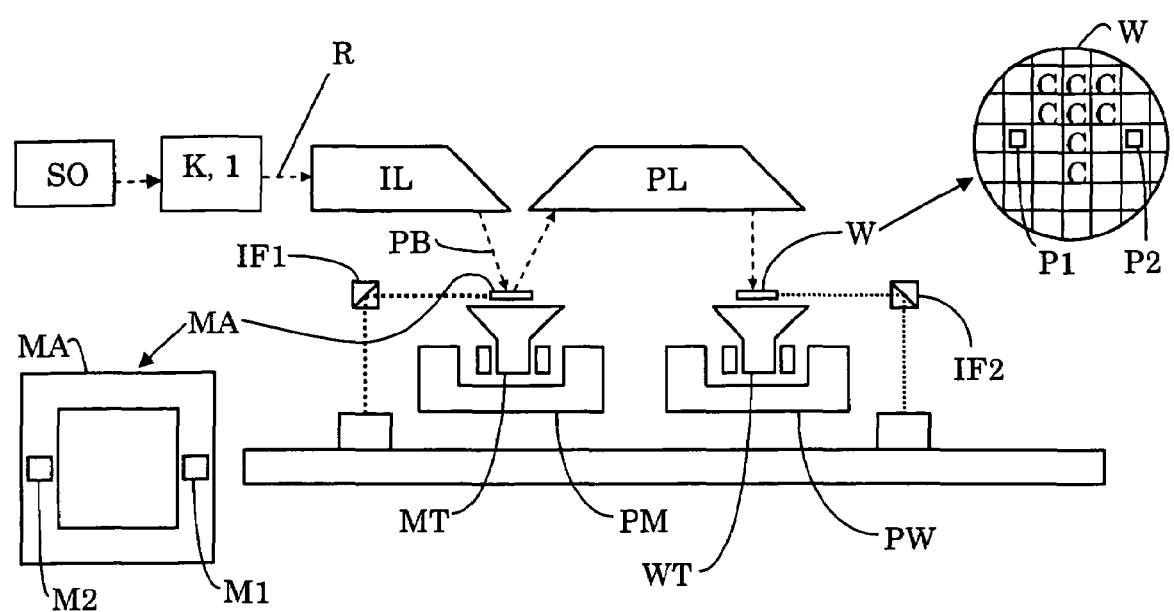
FIG. 1 depicts a lithographic apparatus in accordance with an embodiment of the invention.

FIG. 1 schematically depicts a lithographic apparatus. The apparatus comprises: an illumination system (illuminator) IL for providing a projection beam PB of radiation (e.g. UV or EUV radiation); a first support structure (e.g. a mask table) MT for supporting a patterning device (e.g. a mask) MA and connected to first positioning structure PM for accurately positioning the patterning device with respect to item PL; a substrate table (e.g. a wafer table) WT for holding a substrate (e.g. a resist coated wafer) W and connected to second positioning structure PW for accurately positioning the substrate with respect to item PL; and a projection system (e.g. a reflective projection lens) PL for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

A first radiation source SO is provided for providing radiation R. The radiation R is collected by a collector K. The collector K transmits the collected radiation R in the form of a radiation beam to the illuminator IL. The first source SO and the lithographic apparatus may be separate entities, for example when the source is a plasma discharge source. In such cases, the source is not considered to form part of the lithographic apparatus and the radiation beam is generally passed from the first source SO to the illuminator IL with the aid of the radiation collector K comprising for example suitable collecting mirrors and/or a spectral purity filter. In other cases the source may be integral part of the apparatus, for example when the source is a mercury lamp. The source SO, collector K and the illuminator IL, may be referred to as a radiation system.

The illuminator IL may comprise an adjuster that adjusts the angular intensity distribution of the beam. Generally, at least the outer and/or inner radial extent (commonly referred to as s-outer and s-inner, respectively) of the intensity distribution in a pupil plane of the illuminator can be adjusted. The illuminator provides a conditioned beam of radiation, referred to as the projection beam PB, having a desired uniformity and intensity distribution in its cross section.

The projection beam PB is incident on a patterning device, illustrated in the form of the mask MA, which is held on the mask table MT. Being reflected by the mask MA, the projection beam PB passes through the lens PL, which focuses the beam onto a target portion C of the substrate W. With the aid of the second positioning structure PW and position sensor IF2 (e.g. an interferometric device), the substrate table WT can be moved accurately, e.g. so as to position different target portions C in the path of the beam PB. Similarly, the first positioning structure PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning structures PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes.

In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the de-magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the projection beam is projected onto a target portion C. In this mode, generally a pulsed first radiation source SO is employed and the programmable patterning device may be updated after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
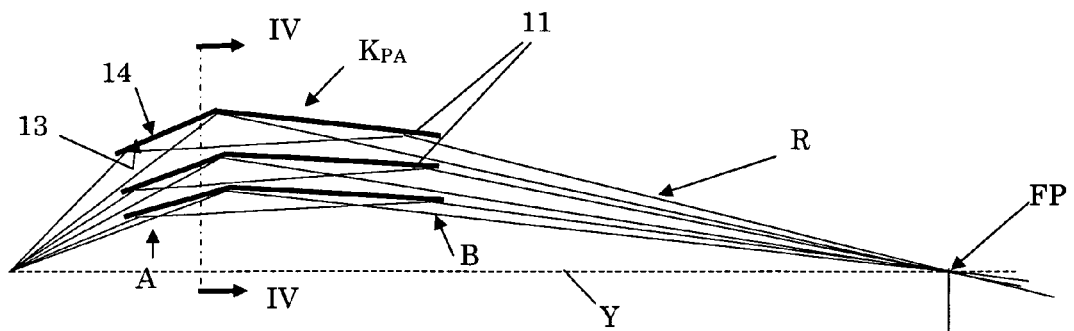
FIG. 2 schematically shows a longitudinal cross-section of part of a collector known from the art, at a first instance of collecting radiation from a radiation source.
Figure 3:
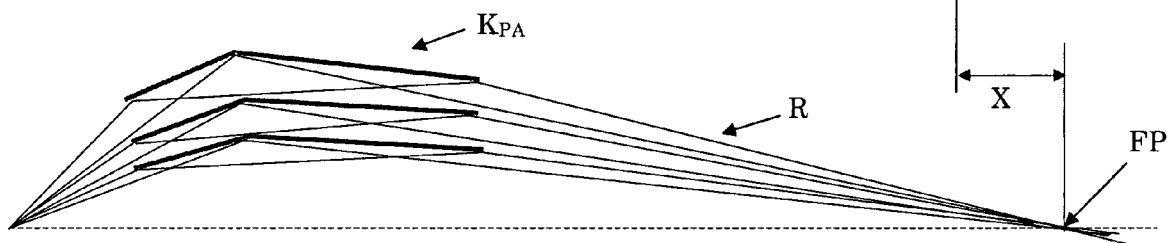
FIG. 3 is a view similar to FIG. 2, at a second instance of collecting radiation from the radiation source.
Figure 4:
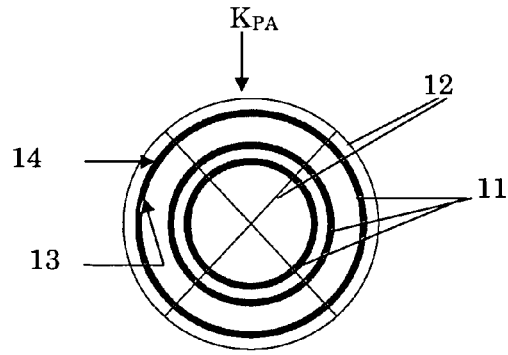
FIG. 4 schematically depicts a cross-section over line IV—IV of FIG. 2.

FIGS. 2–4 show, in more detail, a known collector $K_{P4}$, which can be used in a lithographic apparatus similar to that shown in FIG. 1 instead of the collector of the embodiments of the present invention. The collector $K_{P4}$ comprises mirrors 11 for focussing the radiation R, which radiation the collector $K_{P4}$ receives from a first, intermittent, radiation source SO. The first radiation source SO is depicted in FIG. 1, but not in FIGS. 2–8.

The collector $K_{P4}$ may be arranged at least partly according to the collector as known from EP 1 225 481. For instance, the collector may be suitable for illumination systems with a wavelength of <=193 nm, preferably <=126 mn, particularly preferred, EUV wavelengths. The collector preferably comprises a plurality of reflecting elements 11 in the form of rotationally symmetrical mirror shells, which are arranged in one another around a common axis of rotation. The axis of rotation is depicted by line Y in FIG. 2. The collector shells 11 are attached to each other for instance by coupling members 12, for example spokes or spoke-like elements, as has been depicted in FIG. 4. These coupling members 12 are not depicted in FIGS. 2 and 3. Each reflecting element 11 comprises a reflecting inner surface 13 for reflecting the radiation R, as well as an outer surface 14 or back side which is faced away from the reflecting surface 13, see FIGS. 2 and 4.

The collector $K_{PA}$ is arranged to focus the incoming radiation R onto a certain focus point FP. The focus point may be, for instance, a small focussing area. The focus point FP may be situated, for instance, before the illuminator IL of the lithographic apparatus. During use, the collector $K_{PA}$ will be heated by the incoming radiation R, resulting in an expansion of the collector plates 11. FIGS. 2 and 3 show, that the resulting expansion of the collector shells 11 leads to the shifting of the focussing point FP. The focussing point may, for instance, shift towards the collector $K_{PA}$ or away from the collector $K_{PA}$, depending amongst others on the arrangement and structure of the collector $K_{PA}$. For an illuminator IL, it may be hard or impossible to provide a desired projection beam of radiation PB during such shifting of the radiation focus point. Particularly, the illuminator IL will not be able to provide a projection beam PB having desired constant optical properties for a high precision illumination of a substrate W. To make matters worse, the first radiation source SO of the lithographic apparatus usually only operates during short amounts of time. The first radiation source SO will be switched off, for instance, during substrate W loading and unloading, as well as during substrate illumination in between consecutive substrate dies C. To this aim, the first radiation source SO may be, for instance, a pulsed source. Therefore, the collector $K_{PA}$ receives radiation from the first radiation source SO intermittently, leading to an iterative heating and cooling of the mirror shells 11, resulting in a collector expansion and contraction, as well as a shifting of the focus point FP each time the first radiation source SO is switched on. In FIG. 2, this shift is shown by an arrow X. Further, upstream parts of the collector $K_{PA}$, located near or opposite the first radiation source SO, for instance near a first collector side A, receive higher radiation fluxes than the downstream collector parts which are located further away from the first radiation source SO, for instance near the second collector side B. Besides, each collector shell 11 may receive a different amount of radiation from the first radiation source SO. This leads to an inhomogeneous expansion and contraction of the collector $K_{PA}$. As a result, the shift of foci of the different collector shells 11 is inhomogeneous, leading to a further undesired variation of the generated projection beam of radiation PB (see FIGS. 2 and 3).

Figure 5:
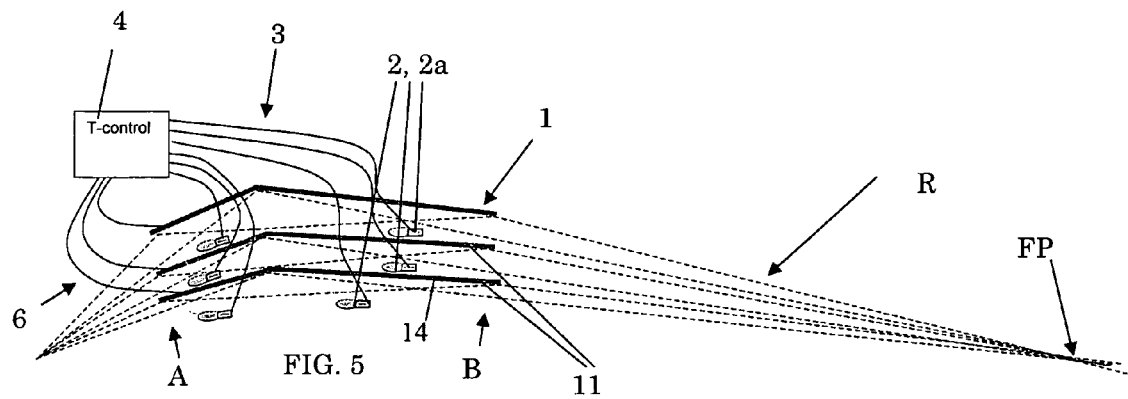
FIG. 5 is a view of a collector according to a first embodiment of the present invention.

FIG. 5 shows a first embodiment of a collector 1 according to the present invention, which can be used in the lithographic apparatus shown in FIG. 1. A number of heaters 2 are provided for heating the collector 1. In the present embodiment, each heater 2 comprises a second radiation source 2a. The heaters 2 are arranged to supply heat to the outer surfaces 14 of the reflecting elements 11 by heat radiation. The heaters 2 are preferably located substantially out of the path of the radiation R which is to be focussed by the collector 1 onto the focussing point FP, to prevent the heaters 2 from blocking the transmission of that radiating R. The heaters 2 may comprise different radiation sources, for instance X-ray sources, infrared light sources, lamps and/or other radiation sources. To absorb heat from the heaters 2, the outer surfaces 14 of the collector shells 11 preferably comprise a heat absorbing material, a heat absorbing coating, for instance a dark or substantially black coating, a heat absorbing structure and/or the like.

The heaters 2 are arranged to heat the collector 1 when the collector 1 receives substantially no radiation from the first radiation source SO. The heaters 2 may also be arranged for heating the collector 1 when the collector 1 receives radiation R from the first radiation source SO. Preferably, the heaters 2 are arranged for maintaining the collector 1 at a certain substantially constant operating temperature, particularly before, during as well as after the use of the first radiation source SO. The heaters may be arranged, for example, to maintain the operating temperature within a range of plus and minus about 50° C. from an average operating temperature, and preferably within a range of plus and minus about 25° C. from an average operating temperature. Depending on the arrangement, composition and/or structure of the collector 1, the heaters 2 may be arranged to maintain the operating temperature within different temperature ranges, for instance smaller or larger temperature ranges.

The heaters 2 are provided with a controller 4, for example a computer, for controlling the heaters 2. The controller 4 may be arranged in several ways. For instance, the controller 4 may be arranged to activate one or more heaters 2 when the first radiation source SO is deactivated. Also, the controller 4 may be arranged to activate one or more heaters 2 when a drop of the temperature of the collector 1, or of one or more collector shells 11, is detected. The controller 4 may also be arranged to control the heaters 2 individually, in groups and/or or simultaneously. Further, the controller 4 may be arranged to switch one or more heaters 2 on and off, wherein each heater 2 provides a substantially constant amount of radiation for heating collector parts 11. On the other hand, the controller 4 may be arranged to control and vary the amount of radiation which is generated by one or more of the heaters 4, as desired.

In the present embodiment, the controller 4 is coupled to the heaters 2 by wiring 3. The coupling between the controller 4 and the heaters may be achieved in various ways, for instance using wireless communication structures, such as one or more transmitters and receivers. One or more controllers 4 may also be integrated in the collector 1 and/or in or near one or more heaters 2. To the skilled person, it is clear how to provide, program and/or arrange such a controller 4 for a desired functioning thereof.

Furthermore, a number of temperature sensors 6 is provided for measuring at least a temperature of at a least part of the collector 1. In the present embodiment, the sensors 6 are arranged to measure temperatures of the reflecting elements 11 of the collector 1. The temperature sensors 6 may be arranged in various ways, for instance comprising thermocouples, radiation detectors or the like. The sensors 6 may for instance be integrated in the collector 1, in the collector shells 11 and/or be located in or near the heaters 2. The sensors 6 may also be connected to the controller 4 by electrical wiring, by wireless communication structures and the like.

The first embodiment, as shown in FIG. 5, is used in the apparatus according to FIG. 1 in a device manufacturing method, comprising: providing a substrate W; providing a projection beam of radiation PB using an illumination system IL; using a patterning device MA to impart the projection beam with a pattern in its cross-section; and projecting the patterned beam of radiation PB onto a target portion of the substrate W.

For providing the projection beam PB, the first radiation source is a intermittent source which, for instance, is arranged to produces radiation pulses. The radiation R, generated by the first intermittent radiation source SO, is collected by the collector 1, to be transmitted to the illumination system IL. The collector 1 is maintained at a substantially constant operating temperature by heating the collector 1, using the heaters 2. The collector 1 may be heated substantially only by the heaters 2 when the collector 1 receives substantially no radiation from the first radiation source SO, such that the operating temperature is maintained substantially constant. The temperature of the collector 1 may be maintained, for instance, within a range of plus and minus about 50° C. from an average operating temperature, and preferably within a range of plus and minus about 25° C. from an average operating temperature, or within a smaller or larger range.

On the other hand, the heaters 2 may heat the collector 1 continuously to such a high operating temperature, that a further heating, which may be caused by absorption of radiation from the first radiation source SO, leads to substantially no or only a small change of the temperature of the collector 1. In this case, the additional heat load, resulting from the radiation R of the first radiation source SO, leads to substantially no or only a small rise of the temperature of the collector 1 with respect to a temperature rise which would occur when the heaters 2 were not implemented. This can also be explained as follows. Radiative thermal transport scales with $T^4$ (wherein T is the temperature in Kelvin). The temperature rise per unit of absorbed power thus scales with $T^3$. Consequently, it is for example found that the temperature rise of a collector 1 at 500 K is 27/125=0.2 times smaller than the temperature rise of a collector 1 at 300 K, for a similar heat input from the source. Thus, it has been found that is advantageous to heat the collector 1 continuously for obtaining a rather constant operating temperature thereof. Also in this case, the temperature of the collector 1 may be maintained, for instance, within a range from an average operating temperature.

Besides, the term "a substantial constant operating temperature" may at least be understood as a temperature within a range of plus and minus about 50° C. from an average collector operating temperature, and preferably within a range of plus and minus about 25° C. from an average operating temperature, or within a smaller range. Herein, the term "average" should be understood as being average concerning the overall collector structure. For instance, different collector parts may have different substantially constant operating temperatures.

Preferably, the amount of heat produced locally by the different heaters 2 is correlated to the amount of radiation R received locally by the respective collector parts, to provide a desired average collector operating temperature. To this aim, the heaters 2 may be arranged to produce different amounts of heat for heating different collector parts, wherein the different amounts of heat are correlated to the amounts of radiation R received by the different collector parts. For instance, the heaters 2 may be arranged to produce more heat at the upstream collector parts, which are located near the first radiation source SO and extend for instance from the first collector side A, compared to the collector parts which are located further away from the first radiation source SO, extending for example towards or near the downstream collector side B. Also, different collector shells 11 may be kept at different operating temperatures. Besides, the heaters 2 may be arranged, for example, to compensate for non-isotropic incoming radiation R.

The controlling of the heaters 2 may be provided by the controller 4. To this aim, the controller 4 may be coupled to the first radiation source SO, for instance such that the controller 4 activates the heaters 2 when the first radiation source SO is switched off, wherein the controller 4 deactivates the heaters 2 when the first radiation source SO is activated again. In that case, the heaters 2 are preferably arranged to supply such an amount of heat to the outer sides 14 of the collector shells 11, that each collector shell 11 experiences substantially no temperature drop due to each switching off of the first radiation source SO. Besides, the controller 4 may be arranged to control the heaters 2 based on the actual temperatures of the collector shells 11, which temperatures may be measured by the temperature sensors 6. On the other hand, the controller 4 may be arranged for heating the collector parts 11 continuously to the high operating temperature.

Since the collector 1 is maintained at or about a certain operating temperature, substantially independently of the operating condition of the first radiation source SO, the location of the focusing point or focussing area FP of the transmitted radiation R remains substantially unaltered with respect to the illuminator IL. Therefore, a projection beam of radiation PB can be provided by the illuminator IL, having a desired substantially constant uniformity and intensity distribution in its cross section, so that devices can be made with high precision.

Figure 6:
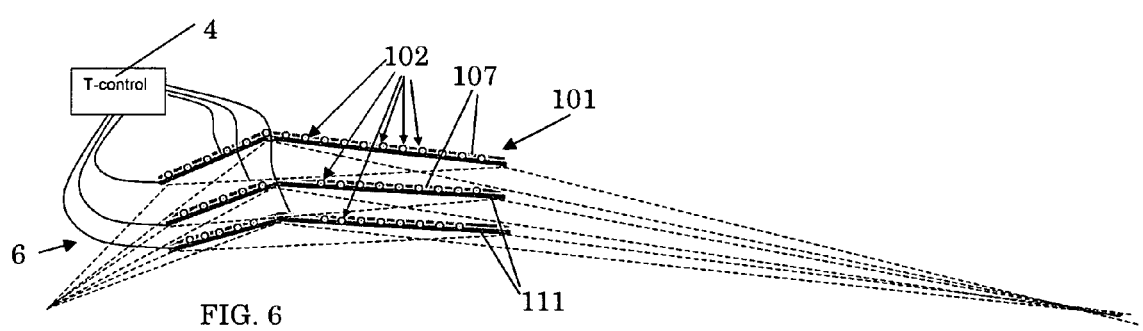
FIG. 6 is a view of a collector according to a second embodiment of the present invention.

FIG. 6 shows a second embodiment 101 of the present invention, which differs from the embodiment shown in FIG. 5, that heating plates 107 are provided for heating the collector shells 111. In the embodiment shown in FIG. 6, heating plates 107 are mounted on the back sides of the reflecting collector shells 111. The heating plates 107 comprise electrical heaters 102 for heating the heating plates 107. The heating plates 107 further comprise, for example, a material having a high coefficient of thermal conductivity, so that the heating plates 107 can be heated relatively homogeneously by the heaters 102. The electrical heaters 102 may comprise, for instance, electrical resistances, electrical wiring, and the like. Also inductive and capacitive heating and/or suchlike heating may be applied. The heaters 102 may, for instance, be in direct and/or indirect contact with the collector shells 111. With a heating arrangement as shown in FIG. 6, the collector 101 can be heated relatively fast and homogeneously to be maintained at or about a desired operating temperature. The functioning of the second embodiment 101 is similar to the described workings of the first embodiment 1. In the present second embodiment, the collector 101 is heated electrically, by the heaters 102 of the heating plates 107. The heating plates 107 can be provided in various ways and shapes. Alternatively, the collector shells 111 may, for instance, integrally comprise electrical heaters 102. Besides, one or more collector shells 111 may be provided with one or more heating layers which serve as electrical heaters, as will be explained below with regard to the fourth embodiment.

Figure 7:
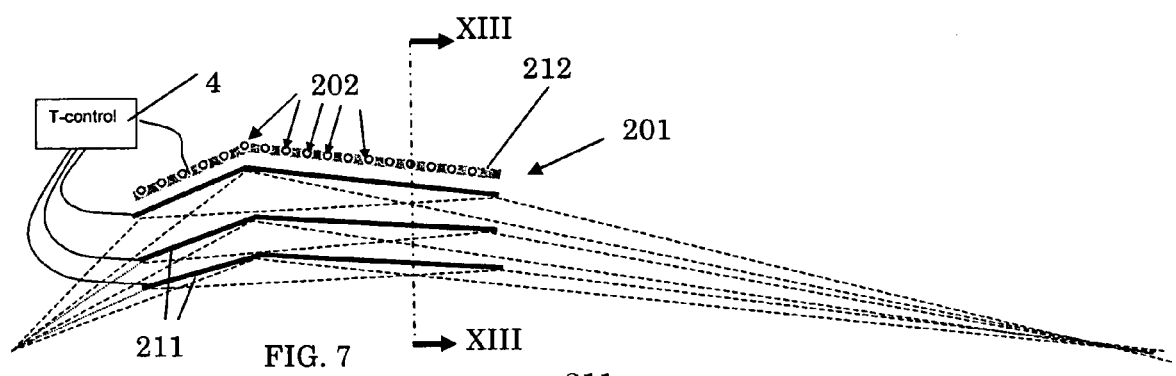
FIG. 7 is a view of a collector according to a third embodiment of the present invention.
Figure 8:
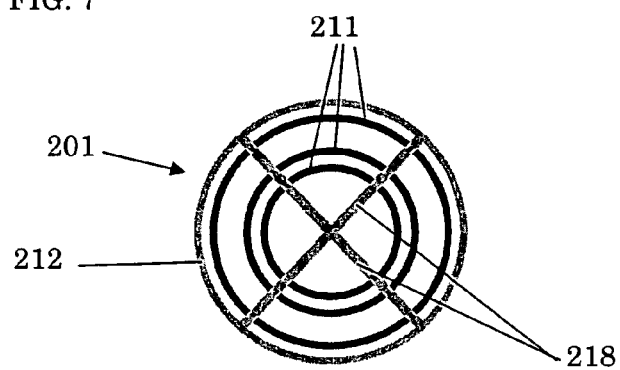
FIG. 8 schematically depicts a cross-section over line VIII—VIII of FIG. 7.

FIGS. 7 and 8 show a third embodiment of the invention. The third embodiment differs from the embodiments shown in FIGS. 5 and 6, that an external electrical heating shield 212 is provided for heating the collector 201. The heating shield 212 is spaced-apart from the outer collector shell 211. The heating shield 212 comprises electrical heaters 202 for heating the heating shield 212. Preferably, the heating shield 212 is mechanically connected to the collector shells 211 by a coupling frame 218, comprising for instance spokes, part of which frame is shown in FIG. 8. Preferably, the coupling frame 218 attaches the heating shield 212 at different locations to each collector shell 211. The heating shield 212 and the coupling frame 218 are heat conducting elements, which are arranged to conduct heat from the heaters 202 to the collector shells 211. To this aim, the heating shield 212 and coupling frame 218 preferably comprise one or more materials having a high heat conduction coefficient. Besides, preferably, the heating shield 212 is arranged to heat the collector 201 by heat radiation, for instance infrared radiation. The functioning of this third embodiment 201 also is substantially similar to the functioning of the first embodiment. In the present case, the collector 201 is heated using the heaters 202 of the heating shield 212, for instance by heat radiation and/or heat conduction.

Figure 9:
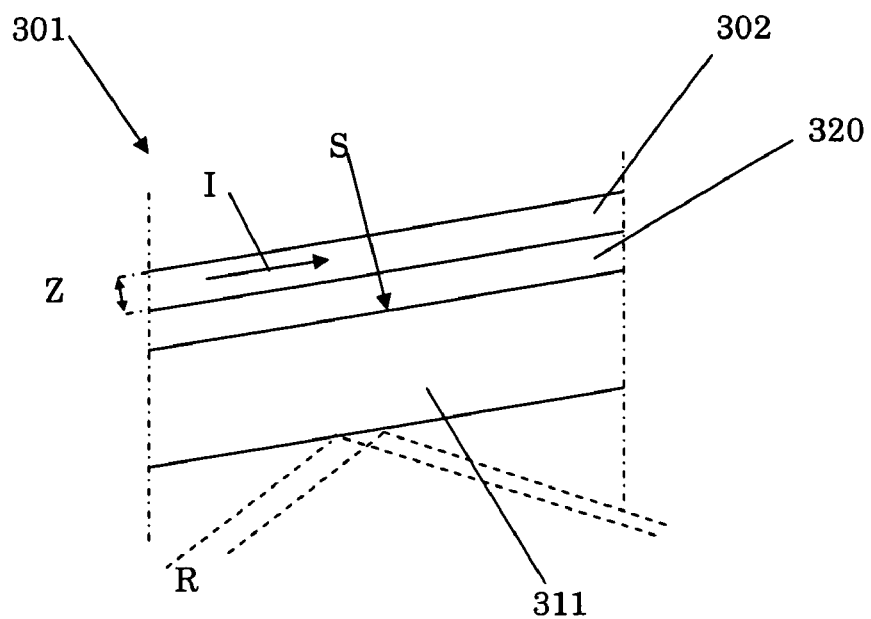
FIG. 9 schematically shows a cross-section of a fourth embodiment of the invention.

FIG. 9 shows part of a fourth embodiment of the invention. Particularly, FIG. 9 depicts a cross-section of one of the collector shells 311 of a collector 301. The fourth embodiment differs from the second embodiment, shown in FIG. 6, that the collector shell 311 has been provided with a heating layer 302, which serves as an electrical heater, instead of a heating plate. In the present embodiment, the heating layer 302 is located on top of an intermediate layer 320 which has been provided on the back side S of the respective collector shell 311, similar to positions of the heating plates shown in FIG. 6. The intermediate layer 320 is arranged to electrically isolate the heating layer 302 from the collector shell plate 311. The intermediate layer 320 may consist, for instance, of one or more suitable isolator materials, for example silicon-oxide, glass and/or other materials. Alternatively, the heating layer 302 may be located directly on top of the collector shell 311, depending amongst others on the electrical resistance of the collector shell 311. Furthermore, more than one heating layer may be provided on and/or in the collector shell 311. Besides, the outer surface of the heating layer 302 may be provided with a covering, for instance comprising one or more protective layers or the like. Furthermore, the collector shell 311 as such may be used for conducting a heating current for heating the collector shell 311.

The heating layer 302 is an electrically conductive layer, for conducting certain electrical heating current. In FIG. 9, this heating current has been depicted by an arrow I. Besides, the heating layer 302 has a certain electrical resistance, so that the heating layer 302 heats up when conducting the heating current I. This can be achieved, for instance, by providing the heating layer 302 with one or more materials having a suitable electrical conductivity. Preferably, the heating layer 302 contains one or more vacuum compliant compounds, for instance nickel and/or other suitable substances. Application of the layer arrangement, shown in FIG. 9, leads to a collector 301 which is particularly suitable for use in a vacuum environment.

Furthermore, the heating layer 302 may have certain suitable dimensions for providing a desired heating layer resistance. For instance, the thickness of the heating layer 302, which thickness is depicted in FIG. 9 by arrow Z, may be relatively small to obtain a desired layer resistance. The use of a thin heating layer 302 also prevents optical losses during use of the collector 301. The thickness Z of the heating layer 302 may be, for instance, smaller than about 100 μm, or for instance smaller than about 10 μm. In that case, the heating layer may substantially consist, for instance, of nickel or a similar material. To the skilled person it is clear, that, depending on the desired heating capabilities of the heating layer 320 and/or on the composition of the heating layer, other heating layer dimensions may also be used.

The functioning of this fourth embodiment 301 is substantially similar to the functioning of the above-described embodiments. During use of the fourth embodiment, the heating layer 302 is used for heating the collector shell 311, such that thermally induced collector shell 311 deformations are substantially prevented. To this aim, a suitable heating current I is applied through the heating layer 302. Suitable structure for providing the current I, for instance a current source, have not been depicted in FIG. 9. To the skilled person, it is clear how to provide and connect a current source to the heating layer 302 for providing a desired heating current. Heating layers 302 of different collector shells 311 of the collector 301 may be provided with different heating currents I, for the case that the different collector shells 311 receive different amounts of radiation from the first radiation source SO. As in the above, a controller 4 may be used for controlling the heating layer 302. The controller 4 may be arranged, for instance, for controlling the power which is electrically dissipated in the heating layer 302. As an example, the electrically induced power dissipation may be controlled such, that a total power absorption by the respective collector shell 311 is substantially constant in time, for instance after switching on the first radiation source SO, so that the temperature of the collector shell 311 remains substantially constant. Herein, the total power absorption includes the power absorption resulting from the radiation of the first radiation source SO.

Figure 10:
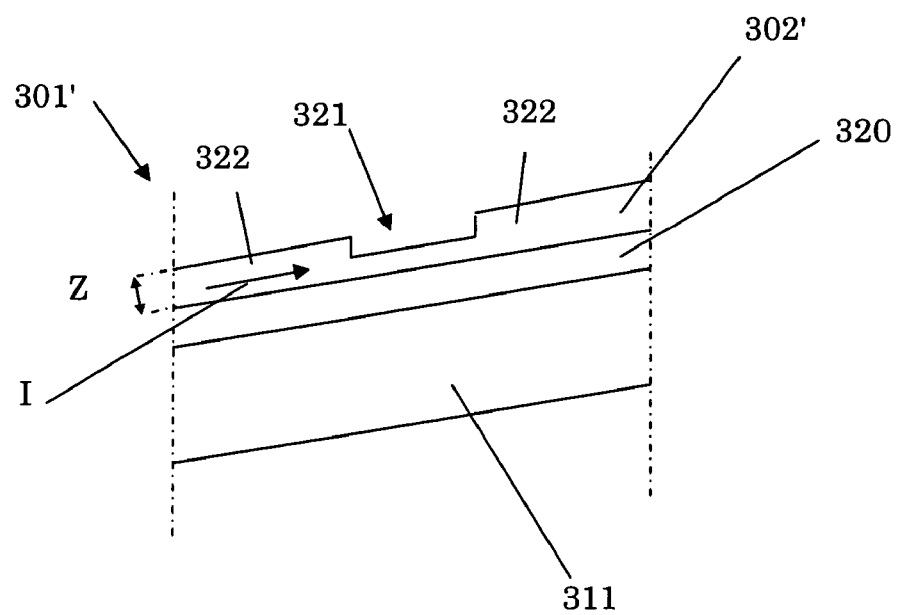
FIG. 10 schematically shows a similar cross-section as FIG. 9, wherein an alternative heating layer has been provided.

FIG. 10 is similar to FIG. 9. However, in FIG. 10, the thickness Z of the heating layer 302' has been varied. In FIG. 10, the heating layer 302' comprises broader parts 322, as well as a grooved part 321 The grooved heating layer part 321 locally provides a higher electrical resistance with respect to remaining broader parts 322 and, consequently, a higher heat dissipation during use. Such grooved part 321 may be manufactured in various ways, for instance using suitable etching techniques, laser etching or the like. The heating layer 302' may comprise a suitable number of such grooved parts 321 for optimising heat dissipation. Besides, the grooved part 321 may be a interruption of the heating layer 302', for instance for forming a local, hot area. Then, the local thickness Z of the heating layer is zero or substantially zero. Furthermore, by interrupting the heating layer 302', the heating layer 302' may be divided into different heating layer parts. During use, one heating current or different heating currents may be applied to different heating layer parts of each collector shell 311.

Preferably, the amount of heat produced locally by the heater 302 is correlated to the amount of radiation R received locally by the respective collector shell 311. This further reduces collector deformation and may prevent, for instance, additional temperature gradients and additional temperature related stress in the collector shell 311 during use of the collector 301. For instance, the local resistance of the heating layer 302 may be correlated to the amount of radiation R received locally by the respective collector shell 311, to further prevent thermal deformations of the collector shell 311 during use. The heating layer 302 may be arranged to produce more heat at upstream collector shell parts, which are located near the first radiation source SO, compared to the collector shell parts which are located further away from the first radiation source SO. To this aim, the current density gradient of the heating current I the heating layer 302 may be higher near upstream collector parts than at the downstream parts thereof. For instance, the heating layer 302 may be relatively thin at upstream collector shell parts, whereas the heating layer 302 may be wider at downstream collector shell parts. The heating layer 302 may have a certain thickness profile, viewed from the first collector side A to the second collector side B. Such thickness profile may be, for instance, substantially inversely proportional to the amount of radiation R received locally by the respective collector shell 311 during use. Besides, the heating layer may comprise a suitable number of grooves layer parts 321 at suitable locations, for providing the desired variation of the local heat production during use. The heating layer thickness may also be varied, for instance, in other directions, for example in circumferential direction with respect to the collector axis Y (see FIG. 2). The heating layer 302 may be dimensioned to compensate for non-isotropic incoming radiation R.

While specific embodiments of the invention have been described above, it will be appreciated that aspects of the invention may be practiced otherwise than as described. The description is not intended to limit aspects of the invention.

For instance, the collector 1 may be arranged in various ways and/or forms and comprise several collector elements 11. The collector 1 may be generally arranged according one or more collectors as described in EP 1225481, and/or otherwise.

Besides, the term "a substantial constant operating temperature" may at least be understood as a temperature within a range of plus and minus about 50° C. from a certain average collector operating temperature, and preferably within a range of plus and minus about 25° C. from a certain average operating temperature, or within a smaller range. Herein, the term "average" should be understood as being average concerning the overall collector structure. For instance, different collector parts may have different substantially constant operating temperatures.

Besides one or more heaters 2, 102, 202, 302, heating elements, heating shields, heating layers, heating structures and the like may be provided for heating the collector.

What is claimed is:

1. A lithographic apparatus, comprising:
   an illumination system constructed to provide a beam of radiation;
   a support structure constructed to support a patterning device, said patterning device serving to impart a cross-section of said beam with a pattern to form a patterned beam;
   a substrate table for holding a substrate;
   a projection system that projects said patterned beam onto a target portion of said substrate;
   a collector being constructed to receive radiation from a first radiation source and transmit radiation to said illumination system;
   at least one heater for heating said collector; and
   a controller configured to control the heater to selectively heat said collector, even when said collector receives substantially no radiation from said first radiation source.

2. An apparatus according to claim 1, wherein said heater includes a second radiation source.

3. An apparatus according to claim 2, wherein said heater includes an electrical heating layer for conducting a heating current, wherein said thickness of said heating layer is predetermined for producing the desired local resistance of said heating layer.

4. An apparatus according to claim 3, wherein said heating layer comprises at least one vacuum compliant substance.

5. An apparatus according to claim 4, wherein said at least one vacuum compliant substance is nickel.

6. An apparatus according to claim 1, wherein said heater includes an electrical heater.

7. An apparatus according to claim 1, wherein said collector includes reflecting elements with reflecting inner surfaces for reflecting said radiation which is received from said first radiation source towards a focussing point.

8. An apparatus according to claim 7, wherein said heater is arranged to supply heat to said reflecting elements of said collector.

9. An apparatus according claim 7, wherein at least one of said radiation reflecting elements is coupled to heat conducting elements, wherein said heater is constructed to heat said reflecting elements by heat transfer through said heat conducting elements.

10. An apparatus according to claim 1, further comprising:
    one or more temperature sensors for measuring at least a temperature of at least part of said collector.

11. An apparatus according to claim 1, wherein said first radiation source is an intermittent radiation source that is structured to produce radiation intermittently.

12. A collector for use in a lithographic apparatus, said collector comprising:
    reflecting elements being constructed to receive radiation from a radiation source, each of said reflecting elements having a reflecting surface to reflect the radiation received from the radiation source towards a focussing point;
    a heater thermally coupled to said reflecting elements; and
    a controller configured to control the heater to selectively heat said reflecting elements, even when said reflecting elements receive substantially no radiation from said radiation source.

13. A method of manufacturing a device, comprising:
    providing a substrate;
    providing a first radiation source;
    transmitting radiation from the first radiation source to an illumination system through a collector;
    providing a beam of radiation using the illumination system;
    imparting the beam with a cross-sectional pattern to form a patterned beam of radiation; and
    projecting the patterned beam of radiation onto a target portion of the substrate; and
    maintaining the collector at a substantially constant operating temperature by selectively heating the collector, even when the collector receives substantially no radiation from the, first radiation source.

14. A method according to claim 13, wherein the maintaining the collector includes heating the collector substantially only when the collector receives substantially no radiation from the first radiation source.

15. A method according to claim 13, wherein the maintaining the collector includes heating the collector continuously to the operating temperature such that further heating caused by absorption of radiation from the first radiation source leads to substantially no change of the temperature of the collector.

16. A method according to claim 13, wherein the maintaining the collector includes the collector receiving radiation pulses from the first radiation source.

17. A method according to claim 13, wherein the maintaining the collector includes using electricity to heat the collector.

18. A method according to claim 17, wherein the maintaining the collector includes heating the collector by at least one further radiation source.

19. A method according to claim 13, wherein the maintaining the collector includes maintaining the temperature of the collector within a predetermined range from an average operating temperature.

20. A method according to claim 13, wherein the maintaining the collector includes producing different amounts of heat for heating different parts of the collector and wherein the different amounts of heat are correlated to the amounts of radiation received by the different parts of the collector from the first radiation source.

21. A method according to claim 13, wherein
the transmitting radiation includes transmitting radiation intermittently.

22. A method according to claim 13, wherein
the maintaining the collector includes activating the heater when the first radiation source is deactivated.

23. A method according to claim 13, wherein
the maintaining the collector includes activating the heater when a drop of the temperature of the collector is detected.

24. A method according to claim 13, wherein
the maintaining the collector includes maintaining a part of the collector at a predetermined, substantially constant operating temperature.

25. A method according to claim 13, wherein
the maintaining the collector includes maintaining a part of said collector within a range from an average operating temperature.

26. A method according to claim 13, wherein
the maintaining the collector includes heating a part of the collector while the collector simultaneously receives radiation from the radiation source.

27. A method according to claim 13, wherein
the maintaining the collector includes producing different amounts of heat for heating different parts of the collector, wherein the different amounts of heat are correlated to the amounts of radiation received from the first radiation source by each of the respective, different collector parts.

28. A method according to claim 13, further comprising:
providing a heating layer to the collector; and
selecting a thickness for the heating layer corresponding to the desired local resistance of the heating layer.

29. A method of manufacturing a device, comprising:
transmitting radiation from a first radiation source to an illumination system through a collector;
maintaining the collector at a substantially constant operating temperature by selectively heating the collector, even when the collector receives substantially no radiation from the first radiation source; and
projecting a beam of radiation onto a target portion of a substrate.

* * * * *